(12) United States Patent
Mondal et al.

(10) Patent No.: US 12,334,892 B2
(45) Date of Patent: Jun. 17, 2025

(54) TRANSMISSION-LINE-BASED RESONANT QUADRATURE CLOCK DISTRIBUTION WITH HARMONIC FILTERING

(71) Applicant: Intel Corporation, Santa Clara, CA (US)

(72) Inventors: Susnata Mondal, Hillsboro, OR (US); Mozhgan Mansuri, Portland, OR (US)

(73) Assignee: Intel Corporation, Santa Clara, CA (US)

(*) Notice: Subject to any disclaimer, the term of this patent is extended or adjusted under 35 U.S.C. 154(b) by 757 days.

(21) Appl. No.: 17/481,956

(22) Filed: Sep. 22, 2021

(65) Prior Publication Data

US 2023/0091086 A1 Mar. 23, 2023

(51) Int. Cl.
*H03H 11/04* (2006.01)
*G06F 1/08* (2006.01)
*G06F 1/10* (2006.01)

(52) U.S. Cl.
CPC ............ *H03H 11/04* (2013.01); *G06F 1/08* (2013.01); *G06F 1/10* (2013.01); *H03H 2011/0488* (2013.01)

(58) Field of Classification Search
CPC .......... H03H 11/04; H03H 11/0405; H03H 2011/0048; H03H 7/01; H03H 7/17; H03H 7/1741; H03H 7/1775; H03H 7/18; H03H 7/12; H03H 2007/38; H03H 2007/383; H03H 2007/386; H03H 2007/013; H03H 2007/0153; G06F 1/08; G06F 1/06; G06F 1/10
USPC ........................................................ 327/556
See application file for complete search history.

(56) References Cited

U.S. PATENT DOCUMENTS

| | | | | |
|---|---|---|---|---|
| 9,065,453 | B2* | 6/2015 | Aryanfar | H03L 7/0802 |
| 9,595,943 | B2* | 3/2017 | Madhavan | H03K 5/00 |
| 2011/0006850 | A1 | 1/2011 | Shibasaki et al. | |
| 2014/0035649 | A1 | 2/2014 | Nedovic | |
| 2014/0333356 | A1 | 11/2014 | Aryanfar et al. | |

(Continued)

FOREIGN PATENT DOCUMENTS

WO 2023048816 3/2023

OTHER PUBLICATIONS

"International Application Serial No. PCT US2022 038377, International Search Report mailed Nov. 1, 2022", 3 pgs.

(Continued)

*Primary Examiner* — Hai L Nguyen
(74) *Attorney, Agent, or Firm* — Schwegman Lundberg & Woessner, P.A.

(57) ABSTRACT

An integrated circuit having a transmission-line-based resonant clock distribution network for distributing a clock signal to one or more nodes, the integrated circuit including a transmission-line-based resonant network formed by one or more clock distribution units. Each clock distribution unit includes a transmission line segment having first and second ends and a resonant circuit connected to the transmission line segment at a position equidistant from the first end and the second end, where the resonant circuit includes an inductor connected in parallel with a capacitor such that the resonant circuit, along with the transmission line segment, collectively has a resonant frequency about a frequency of the clock signal.

18 Claims, 11 Drawing Sheets

(56) References Cited

U.S. PATENT DOCUMENTS

2017/0338772 A1    11/2017   Guthaus et al.
2018/0196463 A1    7/2018   Dusatko

OTHER PUBLICATIONS

"International Application Serial No. PCT US2022 038377, Written Opinion mailed Nov. 1, 2022", 6 pgs.

\* cited by examiner

TRANSMISSION-LINE-BASED RESONANT QUADRATURE CLOCK DISTRIBUTION WITH HARMONIC FILTERING

This application claims the benefit of priority to U.S. patent application Ser. No. 17/481,956, filed Sep. 22, 2021, which is incorporated herein by reference in its entirety.

TECHNICAL FIELD

The document pertains generally, but not by way of limitation, to integrated circuits, and more particularly, to techniques for resonant clock distribution in integrated circuits.

BACKGROUND

Large scale digital communication or data processing systems continue to innovate towards the utilization of higher bandwidth and increasingly parallel communication channels. In an example, nascent high data-rate optical, wireline or wireless communication systems have experienced aggressive scaling to higher bandwidth and multiple transceiver communication channels. In integrated optical, wireline or wireless systems, such as beamforming systems, such communication channels are typically synchronized using one or more high-frequency clocks or timing signals that are distributed by a clock distribution network from signal generator circuitry to each channel or node. One technique for distributing these timing signals includes the use of resonant clock networks or circuitry, such as described in U.S. Pat. No. 7,015,765, which was issued to Kenneth Shepard et al. on Mar. 21, 2006. The Shepard patent describes a circuit for distributing a clock signal in very large-scale integrated circuits which includes a capacitive clock distribution circuit having at least one conductor and at least one inductor formed in a metal layer of the integrated circuit, wherein the inductor(s) is connected to the conductor and has an inductance value selected to resonate with the capacitive clock distribution circuit. The Shepard patent appears to describe a conventional inductor-capacitor resonant clock distribution network. Other technique for clock distribution includes the use of inverter-based repeaters, or resistively terminated transmission lines.

BRIEF DESCRIPTION OF THE DRAWINGS

In the drawings, which are not necessarily drawn to scale, like numerals may describe similar components in different views. Like numerals having different letter suffixes may represent different instances of similar components. Some examples are illustrated by way of example, and not limitation, in the figures of the accompanying drawings.

DETAILED DESCRIPTION

Figure 1:
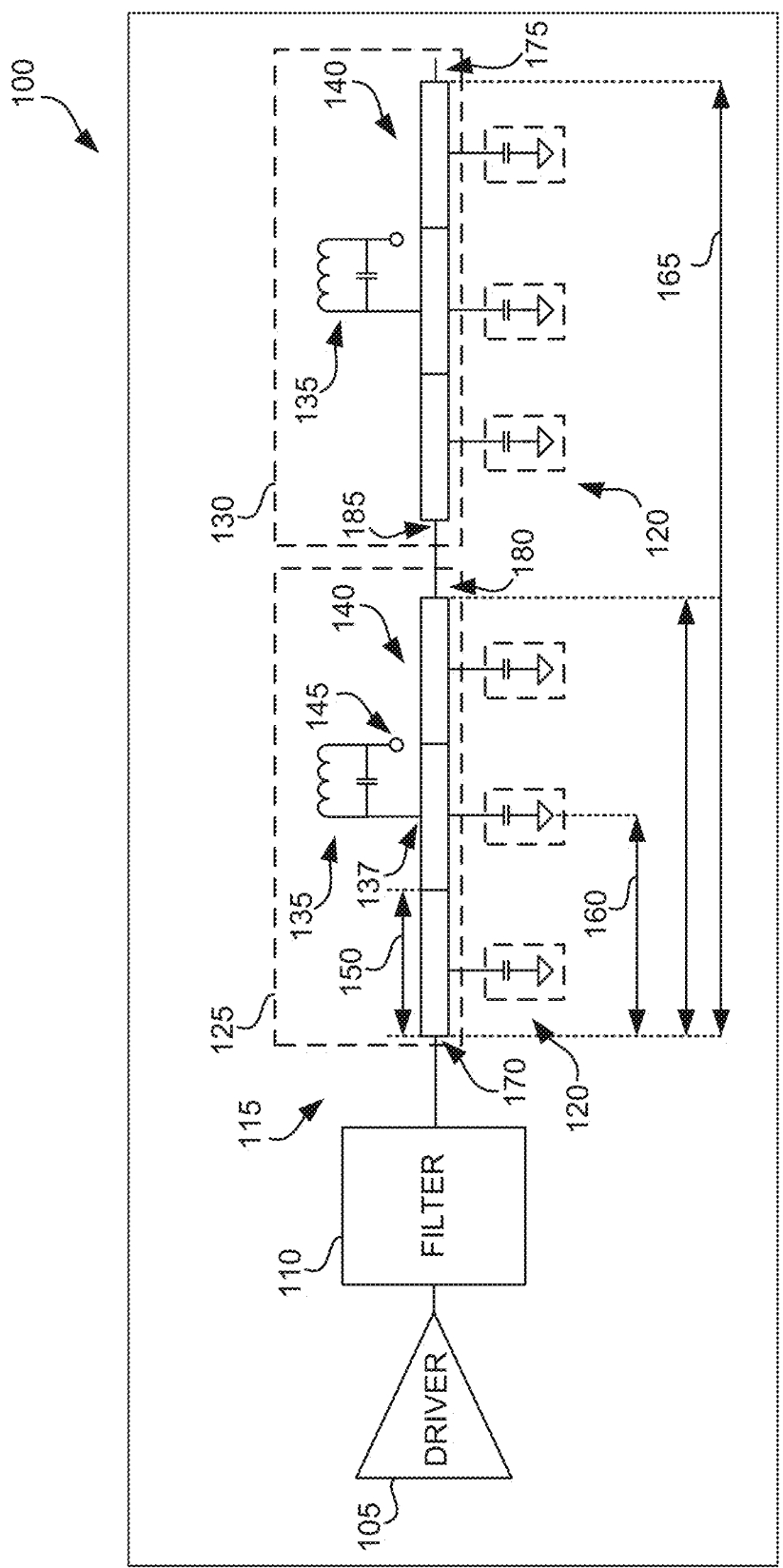
FIG. 1 includes a block diagram of a clock distribution network having a transmission-line-based (TL-based) resonant network formed by one or more clock distribution units.

Increases in bandwidth and degree of parallelism in integrated circuit-based communication and data processing systems generally include commensurate increases in chip size and clock frequency. This can present a number of engineering challenges for distributing clock signals in these circuits. In an example, increased chip size can require the long-range distribution of clock signals, such as by using long transmission lines or complicated grid structures that consume an increasing portion of chip area. In another example, higher clock frequency can require allocation of a greater portion of chip's power budget to timing circuitry, and may cause a clock distribution network to experience increased clock skew or jitter accumulation.

Aspects of the present disclosure are based on the inventors' recognition that existing techniques for distributing clock signals (e.g., resonant clock signals), or timing or synchronized signals (hereinafter referred to collectively as "clock signals") in integrated circuits fail to adequately address each of these challenges. In an example, clock distribution networks that use inverter-based repeaters can suffer from jitter accumulation or supply induced jitter. In another example, resistively terminated transmission line (TL) techniques may not experience the jitter penalties of repeater-based structures, but these techniques can suffer from high power consumption due to their relatively low termination impedance. These techniques may also experience increased jitter from local level converting buffers. In yet another example, resonant circuitry-based clock distribution techniques are generally used for local clock distribution over short TLs with a lumped capacitive load. Such techniques are not directly applicable to a long-range clock distribution, such as where TL inductance and capacitance become the more significant to the network.

Aspects of the present disclosure include techniques (e.g., circuits, devices, systems, or methods) for clock distribution networks that address the disadvantages of existing clock distribution architectures. In an example, these techniques provide jitter advantages associated with repeater-less clock distribution structures, such as resistively terminated TLs. In another example, these techniques provide improvements over the energy efficiency and jitter filtering benefits associated with resonant circuitry-based distribution structures. In addition to these improvements in jitter and energy efficiency, the techniques of the present disclosure provide clock distribution networks for distributing signals using long TLs with reduced amplitude loss, improved signal integrity, and integrated quadrature clock generation.

In an example, the clock distribution networks described herein include a scalable TL-based resonant clock distribution network. Such clock distribution networks include, in an example, one or more clock distribution units (e.g., TL tiles) that are serially connected or cascaded to form a transmission-line-based resonant network. Each clock distribution unit includes a transmission line segment and parallel resonant circuitry formed by an inductor connected in parallel with a capacitor (hereinafter, a "parallel resonant circuit", "parallel resonant circuitry", "parallel LC circuitry", or "resonant termination circuit") to provide resonant termination for the TL segment. Each clock distribution unit has a standing-wave (SW) resonance mode used as a driven network for resonant clock distribution. The parallel resonant circuitry is connected to the TL segment between first and second ends of the TL to provide resonant termination that reduces gain variation across the clock distribution network while maintaining phase-matching within a range of phase error. In an example, the parallel resonant circuitry is connected to the TL segment at a point, position, or location (hereinafter, "point") midway between, or equidistant from, each end of the TL segment. In another example, the parallel resonant circuitry is connected to the TL segment at a point between first and second ends of the TL segment, such that the impedance or loading between the first end of the TL segment and the node including the parallel resonant circuitry is equal to the impedance or loading between the second end of the TL segment and the node including the parallel resonant circuitry. In an example, the capacitance or inductance of the capacitor or inductor of the parallel resonant circuitry is tunable or adjustable, such as by actuation of one or more switching circuits, to adjust or change the resonance frequency of the parallel resonant circuitry or the clock distribution unit, such as to enable the clock distribution network to operate at different, or a wider range of, frequencies or to perform post-fabrication corrections or adjustments to the operation of the network.

In another example, the clock distribution networks described herein includes circuitry to improve the signal integrity of a distributed clock signal through harmonic filtering. The TL-based resonant networks formed by cascading two or more clock distribution units can contain higher resonant frequency modes (e.g., higher than the primary or first harmonic resonant frequency). These higher frequency modes provide a non-negligible gain at the third harmonic frequency of the clock signal being distributed. Additionally, unlike the signals at the primary resonance frequency, the voltages developed at the third harmonic frequency can have different gain or phase at different points along a TL-based resonant network or across a clock distribution network. The variation in gain or phase can cause deterministic jitter, variable slew rate across distribution nodes, phase variation, such as due to modified zero crossings, and reliability concern, such as due to signal overshoot or undershoot beyond the supply and ground rails.

Examples of the present disclosure addresses the issues associated with higher frequency harmonics by including a filter at an input end of the TL-based resonant network formed using the clock distribution units to filter or attenuate unwanted signals, such as third harmonic signals or frequencies. In an example, low-pass filter circuitry, such as circuitry for a passive elliptic low-pass filter, is used at the drive point or input node of the clock distribution network to suppress third harmonic frequencies. In another example, band-stop filter circuitry or a combination of low-pass and band-stop filter circuitry is used at the drive point or input node of the clock distribution network to suppress third harmonic frequencies. The described filter circuitry can reduce signal distortion by suppressing the voltage of signals at the third harmonic frequencies at points across the clock distribution network.

In another example, the clock distribution networks described herein include integrated quadrature clock generation that is obtained by using two parallel TL paths, each with one or more clock distribution units, where inductors in parallel resonant circuitry of the first TL path are electromagnetically coupled with inductors in respective parallel resonant circuitry of the second TL path. According to this configuration, the quadrature phases between the two parallel TL paths (hereinafter, the "I-path" or "in-phase path" and the "Q-path" or "quadrature-phase path") are obtained at the uncoupled resonance frequency of the clock distribution unit. In an example, the in-phase and quadrature-phase path gains are matched by a selection of a coupling factor K between the inductors while maintaining the SW gain and phase matching properties in TL path (e.g., the I-path and the Q-path). The frequency of the quadrature clock distribution network can be tuned or adjusted by changing or adjusting the capacitor, and in some examples, the inductors, used in the parallel resonant circuitry. In an example, the in-phase signal is obtained by driving the in-phase path using a clock signal driver and the quadrature-phase signal is obtained through mutual inductance between the inductors in the in-phase path and the quadrature-phase path. In certain examples, signal loss experienced in the in-phase and quadrature-phase paths is limited below 6 dB, corresponding to the signal loss experienced by two independently driven signal paths (e.g., two paths that do not include quadrature clock generation). The described integrated quadrature clock generation technique reduces system area or die size and improves power efficiency, as compared to other techniques.

FIG. 1 includes a block diagram of a clock distribution network 100 having a transmission-line-based resonant network 115 formed by one or more clock distribution units 125, 130. As shown in FIG. 1, clock distribution network 100 includes drive circuitry 105, filter circuitry 110, transmission-line-based resonant network 115, and one or more nodes 120. In an example, clock distribution network 100 is a TL-based resonant clock distribution network that is configured to distribute or provide a clock signal generated by drive circuitry 105 to nodes 120.

Drive circuitry 105 includes circuitry that is configured to provide a clock signal to be conducted by the clock distribution network 100 to one or more nodes 120. In an example, drive circuitry 105 includes a signal generator, such as oscillator circuitry that is configured to generate and drive a digital or analog timing signal. In another example, drive circuitry 105 includes buffer or amplifier circuitry that is configured to provide current or voltage for driving a received timing signal through clock distribution network 100. In another example, drive circuitry 105 includes transmitter circuitry that is configured to generate digital or analog data signals to be conducted by clock distribution network 100. In yet another example, driver circuit 105 includes one or more combination of any of the previously discussed driver circuit. Drive circuitry 105 generally drives a clock signal having an indicated frequency or range of frequencies through the clock distribution network 100 to nodes 120.

In some examples, drive circuitry 105 includes an input (not shown) connected to receive timing or data signals generated by a signal source or signal generator. In another example, drive circuitry 105 includes an output to drive the timing or data signal through TL-based resonant network 115 or clock distribution network 100.

Nodes 120 can include any circuitry, such as synchronized digital circuitry that receives or uses a distributed clock provided by clock distribution network 100. Nodes 120 can each present a capacitive load, such as a 25 femtofarads (fF) load, to drive circuitry 105. Additionally, TL-based resonant network 115 can present a resistive, inductive, or capacitive load, which in some cases may include the capacitive load of nodes 120, to drive circuitry 105. In an example, driver circuitry 105 is configured to provide a specified drive current and output voltage for driving a timing signal or other signal through clock distribution network 100 in view of these loading conditions.

Filter circuitry 110 includes circuitry that is configured to filter one or more ranges of frequencies from signals conducted by TL-based resonant network 115 or clock distribution network 100. Such filtering includes attenuating, blocking, or rejecting voltages or currents associated with signals having the filtered frequencies to limit the impact of these voltages or currents on the amplitude, phase, or gain of the passed or unfiltered signals conducted by TL-based resonant network 115 or clock distribution network 100. Such filtering can include shifting the signals having the filtered frequencies to a different range of frequencies such as to limit the impact of the voltages or currents of these signals on the amplitude, phase, or gain of the passed or unfiltered signals conducted by TL-based resonant network 115 or clock distribution network 100. In an example, filter circuitry 110 includes low-pass filter circuitry, such as circuitry of a passive elliptic low-pass filter that is configured to block or filter signals that are at or about (e.g., within an indicated range of frequencies), and above the third harmonic frequency of the primary resonant frequency of clock distribution unit 125 or 130. In another example, filter circuitry 110 include passive band-stop filter circuitry that is configured to attenuate, block, or reject frequencies that are within an indicated range of the third harmonic frequency of the primary resonant frequency of clock distribution unit 125 or 130. Such filters can have a cutoff frequency or a band-stop frequency about the third harmonic frequency of the primary resonant frequency of clock distribution unit 125 or 130.

Transmission-line-based resonant network 115 includes circuitry, such as conductive wiring or one or more electrical components, which is configured to receive a clock signal from drive circuitry 105 and to transmit the received signal to one or more nodes 120. In an example, TL-based resonant network 115 includes circuitry that is configured to receive or obtain a resonant clock signal from drive circuitry 105 (e.g., TL-based resonant network 115 is driven by the drive circuitry) within an indicated frequency range and transmit or conduct the received signal to nodes 120. In an example, transmission-line-based resonant network 115 configured to transmit the received signal along a substantially straight path (e.g., a path that is straight or linear within an indicated margin or variation). In an example transmission-line-based resonant network 115 is configured to conduct the received signal along a path that is longer than at least $$\frac{1}{10}, \frac{1}{8}, \text{ or } \frac{1}{4}$$

of the wavelength of the received signal propagating along the TL.

Transmission-line-based resonant network 115 includes ends 170 and 175, and a conductive path having a length 165 between these ends. In an example, length 165 is at least $$\frac{1}{8}$$

of the wavelength of the received clock signal propagating along TL-based resonant network 115.

In an example, the conductive path of TL-based resonant network 115 is formed by one or more cascaded or serially connected clock distribution units 125 or 130, such that the length 165 of TL-based resonant network 115 can be increased, or clock distribution network 100 can be scaled to support additional nodes, by increasing the number of serially connected clock distribution units used to form the transmission-line-based resonant network. In an example, the length 165 of TL-based resonant network 115 is scalable to a length D using k clock distribution units 125 or 130, where each clock distribution unit has a TL segment 140 having a length d provided as an indicated fraction of the wavelength λ of the received clock signal in the TL as indicated in expression (1). In an example, the length d of TL segment 140 is selected based on an indicated amount of loss in gain that can be tolerated by clock distribution network 100, and an indicated amount on variation in gain that can be tolerated between signals distributed to nodes 120.

$$D = k \times d \tag{1}$$

Each clock distribution unit 125 or 130 is substantially identical and includes a TL segment 140 and parallel resonant circuitry 135 that provides LC resonant termination for the TL. In a configuration where two or more clock distribution units 125 and 130 are used to form TL-based resonant network 115, parallel resonant circuitry 135 provide multipoint or distributed LC resonant termination for the TL.

In various examples, TL segments 140 in each clock distribution unit are equally sized, such as to have substantially the same loading (e.g., capacitive loading) or impedance. Each TL segment 140 can further be divided (e.g., logically divided) into two or more channels having substantially equal length 150. Each channel can be connected to a node 120, such as to connect a transmitted clock signal to circuitry or signal transmission components connected to or associated with the nodes. In an example, each node 120 is connected to a corresponding channel at a point half way between, or equidistant from, each end of the channel. In another example, each node 120 is connected to a corresponding channel at a point at either end of the channel.

In example, parallel resonant circuitry 135 of each clock distribution unit. 125 or 130 have matched capacitors or inductors which determine the resonant frequency (e.g., the primary resonant frequency) of TL-based resonant network 115 or clock distribution network 100. As shown in FIG. 1, parallel resonant circuitry 135 is connected to TL segment 140 at a point or node 137 and to another node 145 of clock distribution network 100. In an example, node 145 is reference node, such as a ground rail. In another example, nodes 137 and 145 are nodes or positions on differential signal lines of a differential TL segment. Parallel resonant circuitry 135, in various examples, is connected to TL segment 140 at node 137 at a distance 160 (e.g., a midpoint between, or a point equidistant from, each end of the TL segment 140) from each end of the TL. In other examples, parallel resonant circuitry 135 is connected to TL segment 140 at node 137 such that the impedance or loading between a first end of the TL segment and node 137 is equal to impedance or loading between a node 137 and a second end of the TL segment.

TL-based resonant network 115 is formed by cascading or serially connecting clock distribution units 125 and 130 such that the total length of TL-based resonant network 115 includes the combined length of each TL segment 140 of the clock distribution units. Such cascading or serial connecting can include physically connecting an end 180 of clock distribution unit 125 and an end 185 of clock distribution unit 130. Each end can be connected by connecting corresponding signal lines (e.g., corresponding single-ended or differential signal lines) or reference lines using one or more metal layers of an integrated circuit fabrication process.

Figure 2:
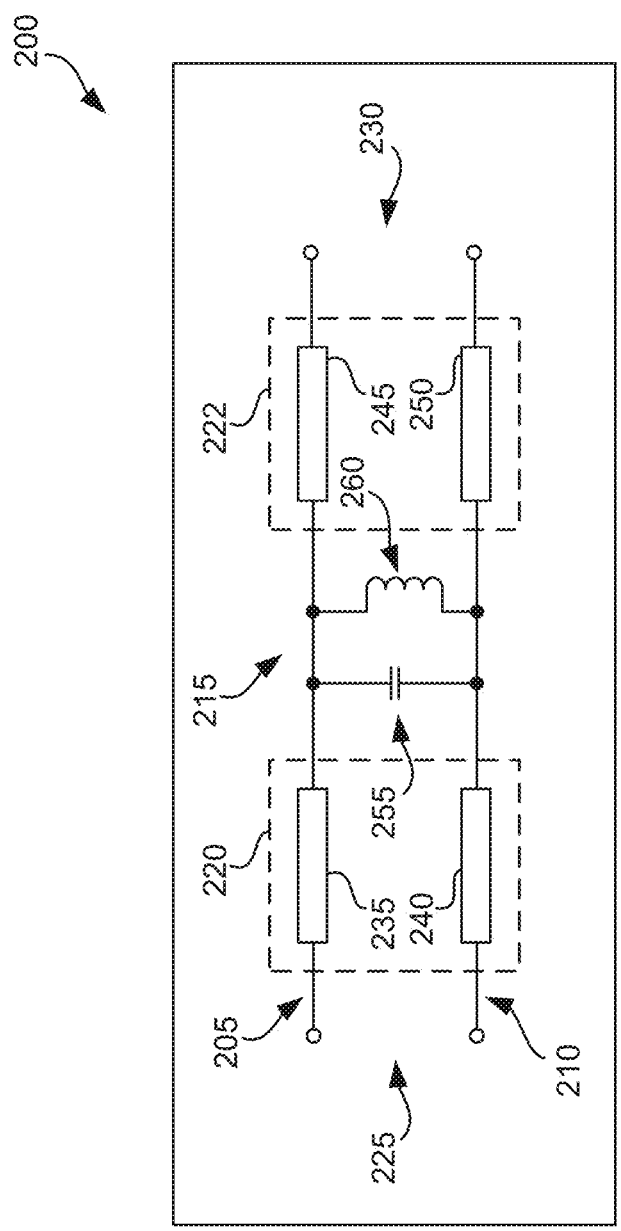
FIG. 2 illustrates a block diagram of an example of a clock distribution unit.

FIG. 2 illustrates a block diagram of an example of a clock distribution unit 200. The clock distribution unit 200 is an example of clock distribution unit 125 or 130, as shown in FIG. 1. Clock distribution unit 200 includes first TL segment 205, second TL segment 210, parallel resonant circuitry 215, input node 225 and output node 230. In an example, input node 225 is connected to drive circuitry, such as drive circuitry 105, or to another clock distribution unit to receive a signal (e.g., a resonant clock signal), while output node 230 can be connected to additional circuitry or to another clock distribution unit to transmit the received signal. Clock distribution unit 200 is an example of a TL unit cell or tile, such as cell in computer aided design tool (CAD), used to design and fabricate integrated circuitry. In an another example clock distribution unit 200 is an example of a unit of circuitry integrated in integrated circuit device or system. Two or more substantially identical clock distribution units 200 can be replicated and cascaded or serially connected to form a scalable TL, such as TL-based resonant network 115, according to any of the techniques described herein.

First TL segment 205 and second TL segment 210 include one or more conductors that are configured to conduct or transmit signals across a clock distribution network, as described herein. In an example, first TL segment 205 includes a signal line and second TL segment 210 includes a reference line. In another example, such as a configuration of clock distribution unit 200 where first TL segment 205 and second TL segment 210 are configured to transmit or conduct differential signals, the TL includes differential signal lines, along with one or more reference lines (not shown). First TL segment 205 and second TL segment 210 have a distributed impedance $Z_0$ and a conductor length d between input node 225 and output node 230. Parallel resonant circuitry 215 is connected to first TL segment 205 and second TL segment 210 between input node 225 and output node 230, such that the impedance or the conductive length of the TL is distributed or grouped as TL element 220 and TL element 222. TL element 220 includes TL segments 235 and 240. TL element 222 includes TL segments 245 and 250. In an example, first TL segment 205 and second TL segment 210 are uniformly distributed along its length and parallel resonant circuitry 215 is connected at a midpoint between, or equidistant from, input node 225 and output node 230, respectively. In this configuration, TL element 220 and 222 equally divide the length d such that TL segments 235, 240, 245, and 250 each have length d/2, and TL element 220 and 222 each have equal characteristic impedance $Z_0$. In an example, first TL segment 205 and second TL segment 210 are nonuniformly distributed along its length (e.g., load or impedance is not uniform along the length of the TL) and parallel resonant circuitry 215 is connected at a point between the input node 225 and output node 230, such that the impedance or loading of TL elements 220 and 222 to the parallel resonant circuitry 215 are equal.

Parallel resonant circuitry 215 includes capacitor 255 and inductor 260. Capacitor 255 and inductor 260 can include a network of one or more respective capacitors or inductors. In an example the values of capacitor 255 and inductor 260 are selected to cause parallel resonant circuitry 215, when connected to first TL segment 205 and second TL segment 210, to have a resonant frequency that is at or about (e.g., within an acceptable frequency range) of the operating frequencies of signals conducted by first TL segment 205 and second TL segment 210. In some examples, the values of capacitor 255 or inductor 260 are adjustable, such as by connecting one or more capacitors in the capacitor network or one or more inductors in the inductor network to first TL segment 205 or second TL segment 210 using controllable switching circuitry (not shown). In an example, the controllable switching circuitry can be actuated to tune or adjust the resonant frequency by switching one or more capacitors or inductors in or out of the parallel resonant circuit 215.

Clock distribution unit 200 can be fabricated using standard integrated circuit fabrication techniques according to the diagrams or techniques described herein. In an example, first TL segment 205 and second TL segment 210 are implanted as a coplanar waveguide in a first metal layer with a ground shield, such as to limit or inhibit gain loss. Inductor 260 can be implemented as a multi-turn spiral inductor at the first metal layer while capacitor 255 can be implanted using standard techniques to form capacitors in such processes.

Figure 3:
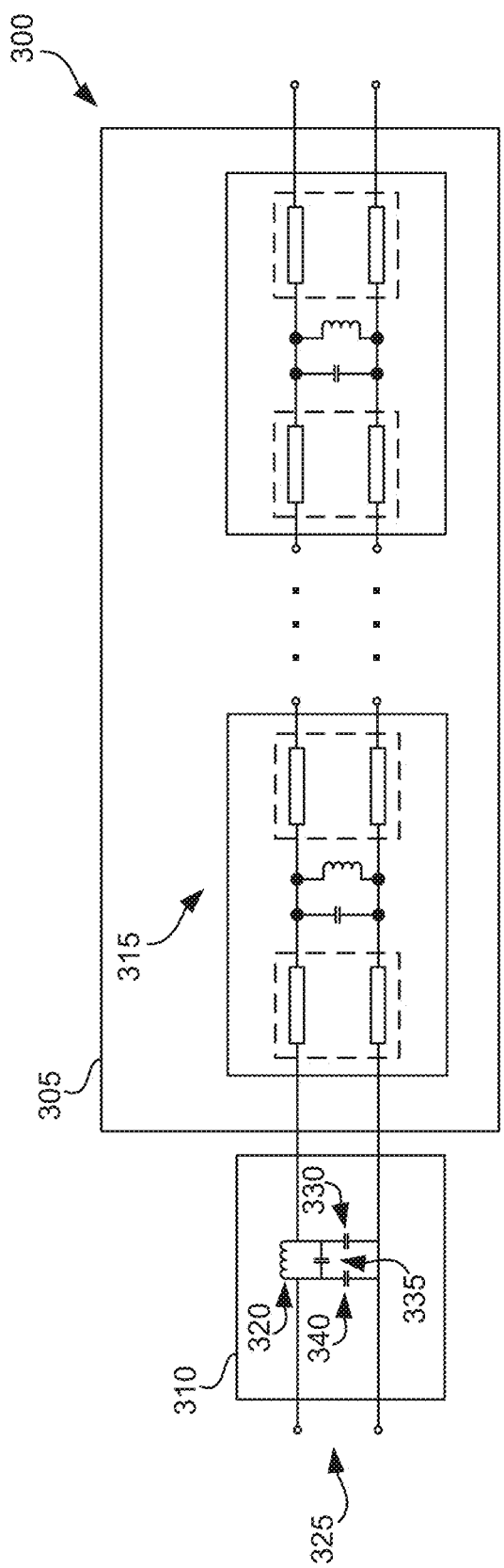
FIG. 3 illustrates an example of a clock distribution network having filter circuitry and a transmission-line-based resonant network including two or more clock distribution units.

FIG. 3 illustrates an example of a clock distribution network 300 having filter circuitry 310 and TL-based resonant network 305 including two or more clock distribution units 315. Filter circuitry 310 is an example of filter circuitry 110 (FIG. 1), TL-based resonant network 305 is an example of TL-based resonant network 115, and clock distribution units 315 are examples of clock distribution units 125, 130, or 200. FIG. 3 depicts filter circuitry 310 as a passive elliptic hybrid band-stop and low-pass filter formed by inductor 320, and capacitors 330, 335, and 340. The filter is configured to receive a driven clock signal at input 325 and provide a filtered output to TL-based resonant network 305. Other suitable filter circuitry, however, can be used to filter the received signal and connect the filtered output to TL-based resonant network 305. Filter circuitry 310 is configured (e.g., by selection of suitable values for inductor 320, and capacitors 330, 335, and 340) to filter third harmonic frequencies of the primary resonant frequency of the resonant circuitry in clock distribution unit 315.

Figure 4A:
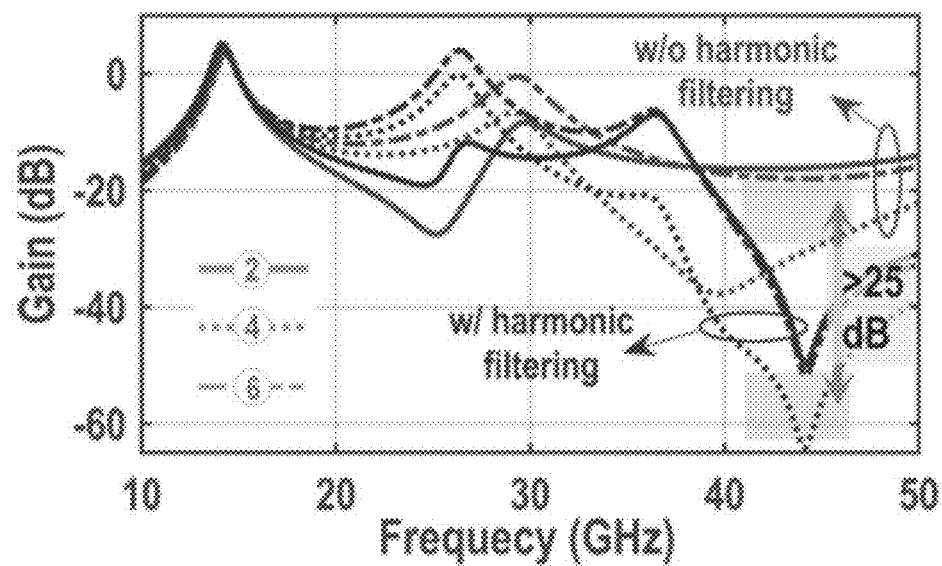
FIGS. 4A and 4B illustrate examples of simulated performance data obtained from a clock distribution network having barmonic filtering and a TL-based resonant network formed using two or more clock distribution units.
Figure 4B:
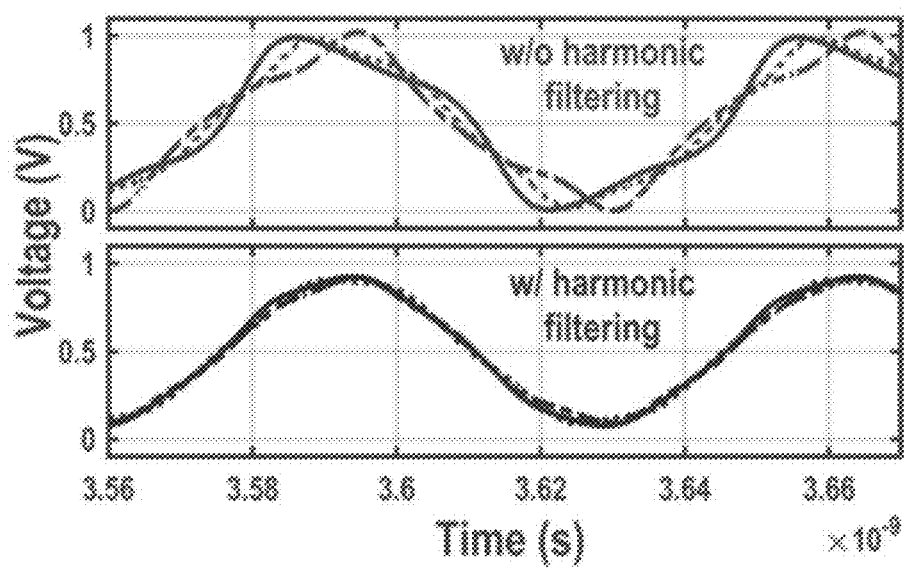

FIGS. 4A and 4B illustrate examples of simulated performance data obtained from a clock distribution network having harmonic filtering and a TL-based resonant network formed using two or more clock distribution units. Referring to equation (1), the indicated data was obtained from an integrated circuit fabricated using a fabrication process for a clock distribution unit having a TL segment length d of 750 µm, and k=2. The clock used to drive the clock distribution network was distributed to six channels, having 250 µm pitch and 25 fF load capacitance per channel. FIG. 4A shows gain as a function of signal frequency. As shown in FIG. 4A, there is a reduction in gain at third harmonic frequency that exceeds 20 dB when harmonic filter is used in the clock distribution network. FIG. 4B, shows voltage as a function of time. As shown in FIG. 4B, improvement in signal distortion is obtained by suppressing or filtering third harmonic voltages using the filtering techniques described herein.

Figure 5:
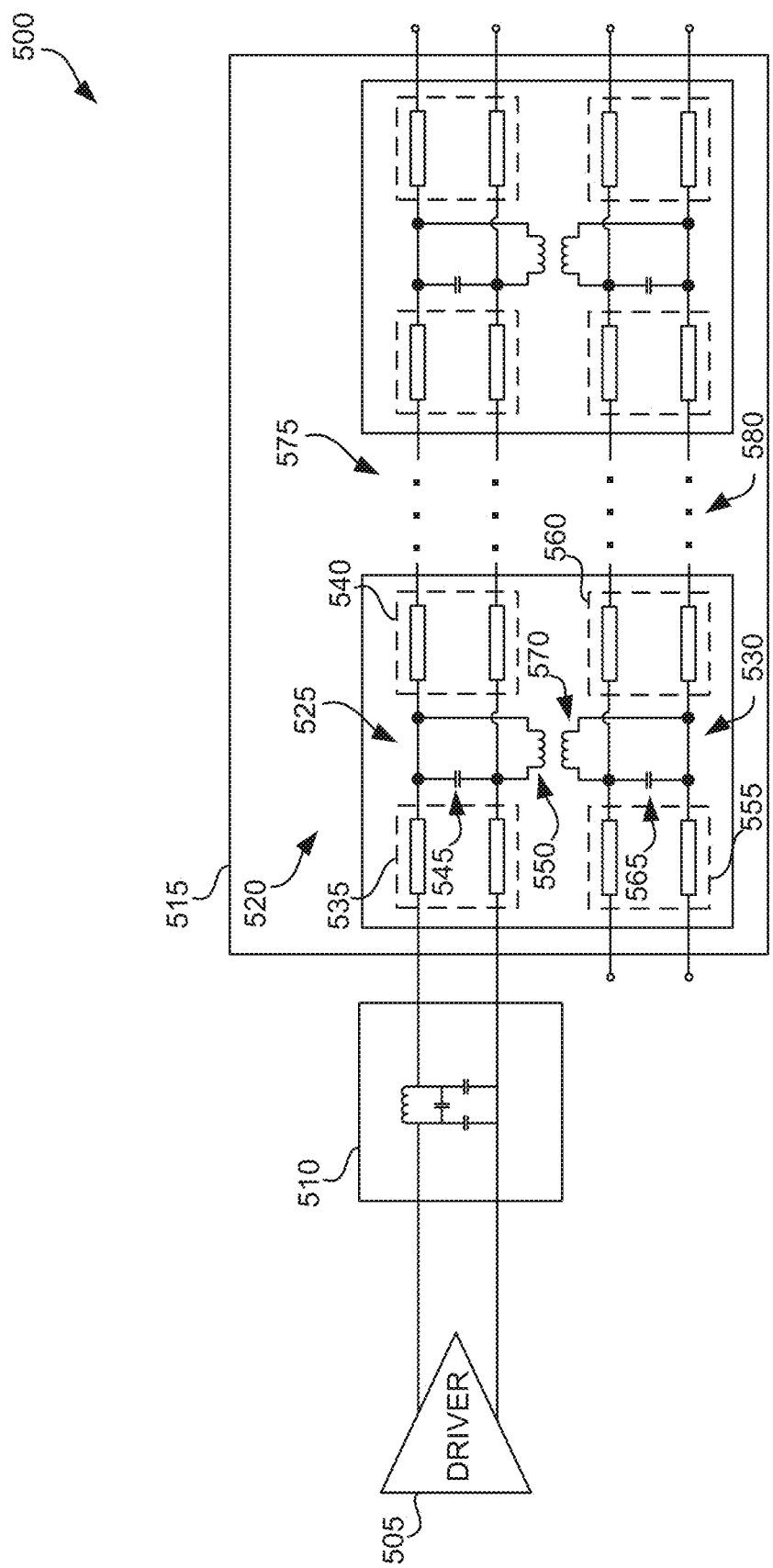
FIG. 5 illustrates an example of a clock distribution network for distributing quadrature clock signals.

FIG. 5 illustrates an example of a clock distribution network 500 for distributing quadrature clock signals. The clock distribution network 500 includes drive circuitry 505, filter circuitry 510 and transmission-line-based resonant network 515 formed by one or more clock distribution units 520. Drive circuitry 505 and filter circuitry 510 are each an example of the drive circuitry and filter circuitry described in the discussion of FIG. 1-3. Each clock distribution unit 520 includes a first clock distribution sub-unit coupled in parallel with a second clock distribution sub-unit. The first clock distribution sub-unit is example of the previously described clock distributions units and is formed by transmission line segments 535 and 540, and parallel resonant circuitry 525. The second clock distribution sub-unit is a substantially identical example of the first clock distribution unit and is formed by transmission line segments 555 and 560, and parallel resonant circuitry 530. The first clock distribution sub-unit is electromagnetically coupled to the second clock distribution sub-unit through mutual inductance between their respective matched resonant circuitry inductors 550 and 570.

In operation, one or more first clock distribution sub-units form an in-phase path 575 that is driven by drive circuitry 505 to distribute a clock signal that is in-phase with the signal provided by the drive circuitry. One or more second clock distribution sub-units form a quadrature-phase path 580 that is coupled to the in-phase path 575 to distribute a clock signal that has a 90-degree phase shift relative to the clock signal conducted in the in-phase path. Capacitors 545 and 565 can be tuned or adjusted to correct of variations in the resonant frequency of the in-phase and quadrature-phase paths.

Figure 6A:
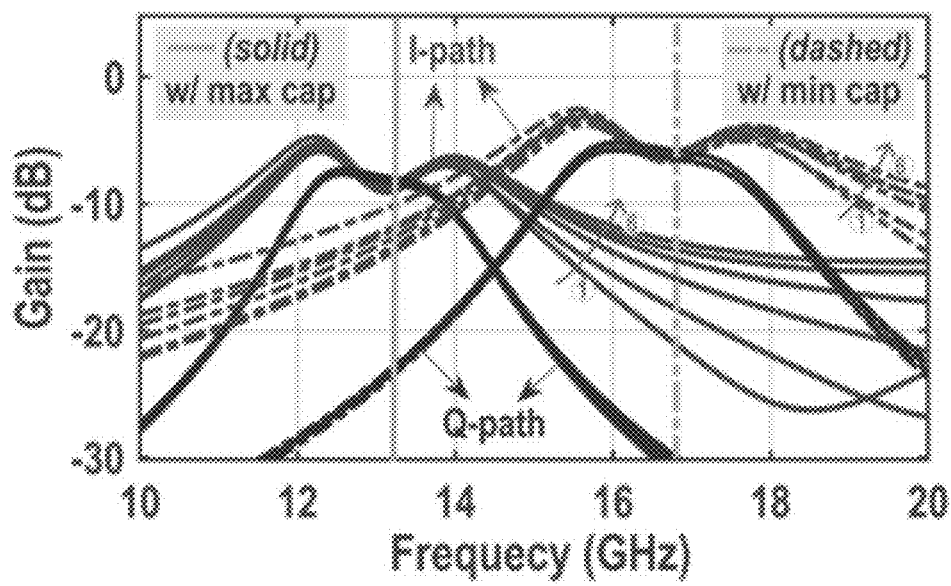
FIGS. 6A and 6B illustrate examples of simulated performance data obtained from a clock distribution network for distributing quadrature clock signals.
Figure 6B:
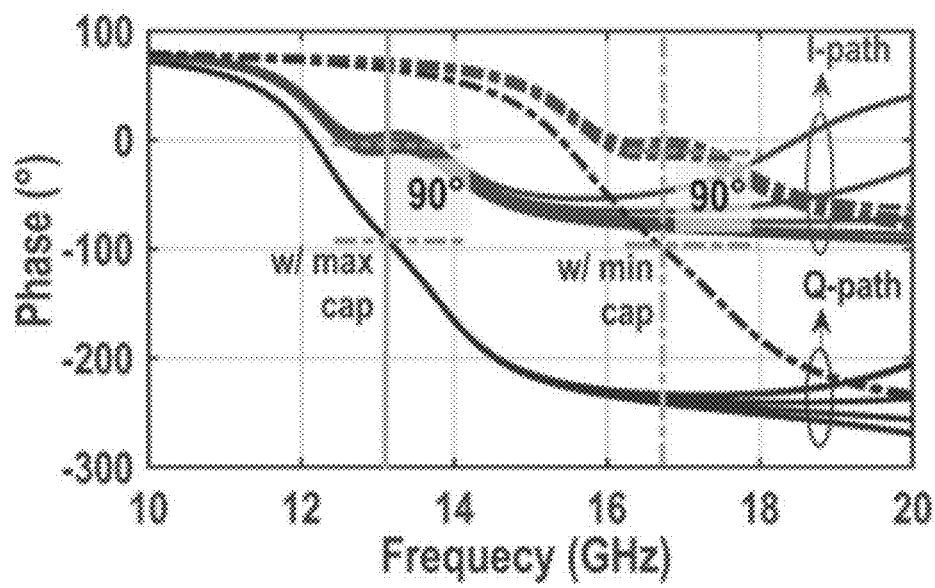

FIGS. 6A and 6B illustrate examples of simulated performance data obtained from a clock distribution network, such as the clock distribution network 500, for distributing quadrature clock signals. The performance data was obtained from an integrated circuit fabricated according to the specifications of the integrated circuit described in the discussions FIGS. 4A and 4B. As shown in FIG. 6A, signal gain as a function of frequency in the in-phase path is matched to the signal gain in the quadrature-phase path, with each path exhibiting a worst-case reduction in gain of 6 dB as compared paths without quadrature generation. FIG. 6B, illustrates quadrature-phase tuning using parallel resonant circuitry capacitors in the in-phase and quadrature-paths.

Figure 7:
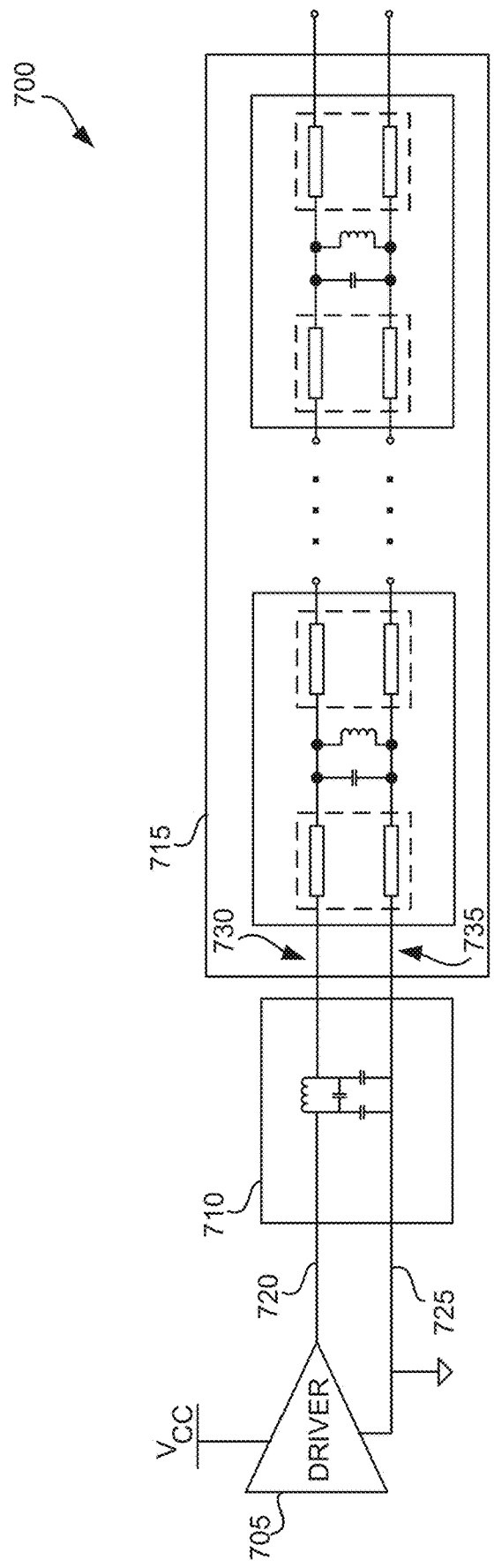
FIG. 7 illustrates an example of a clock distribution network that is configured to distribute a single-ended clock signal.

FIG. 7 illustrates an example of a clock distribution network 700 that is configured to distribute a single-ended clock signal. In an example, clock distribution network 700 includes drive circuitry 705, filter circuitry 710, and TL-based resonant network 715. Filter circuitry 710 and TL-based resonant network 715 correspond to any of the filters or TL-based resonant networks described herein. Drive circuitry 705 includes circuitry corresponding to any of the drive circuitry described herein, and is configured to drive a single-ended clock signal through clock distribution network 700. In an example, drive circuitry 705 has signal path 720 and a reference path 725 that is connected, respectively, to a signal path 730 and reference path 735 of TL-based resonant network 715 to drive the single-ended clock signal through clock distribution network 700.

Figure 8:
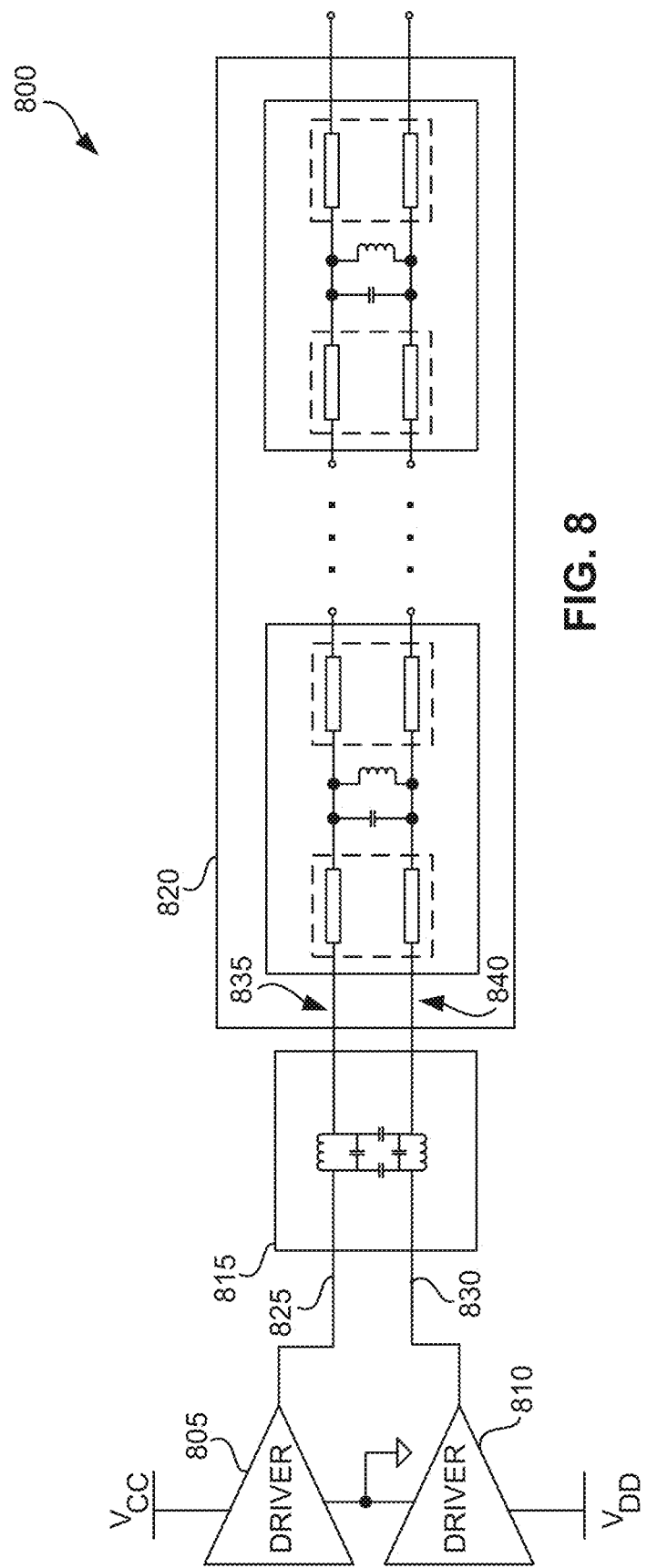
FIG. 8 illustrates an example of a clock distribution network that is configured to distribute a differential clock signal.

FIG. 8 illustrates an example of a clock distribution network 800 that is configured to distribute a differential clock signal. In an example, clock distribution network 800 includes drive circuitry 805 and 810, filter circuitry 815, and TL-based resonant network 820. Filter circuitry 815 and TL-based resonant network 820 correspond to any of the filters or TL-based resonant networks described in the discussion herein. Drive circuitry 805 and 810 includes circuitry corresponding to any of the drive circuitry described herein, and is configured to drive a differential clock signal through clock distribution network 800. In an example, drive circuitry 805 and 810 includes differential signal paths 825 and 830 that is connected, respectively, to a differential signal paths 835 and 840 of TL-based resonant network 820 to drive the differential clock signal through clock distribution network 800.

Figure 9:
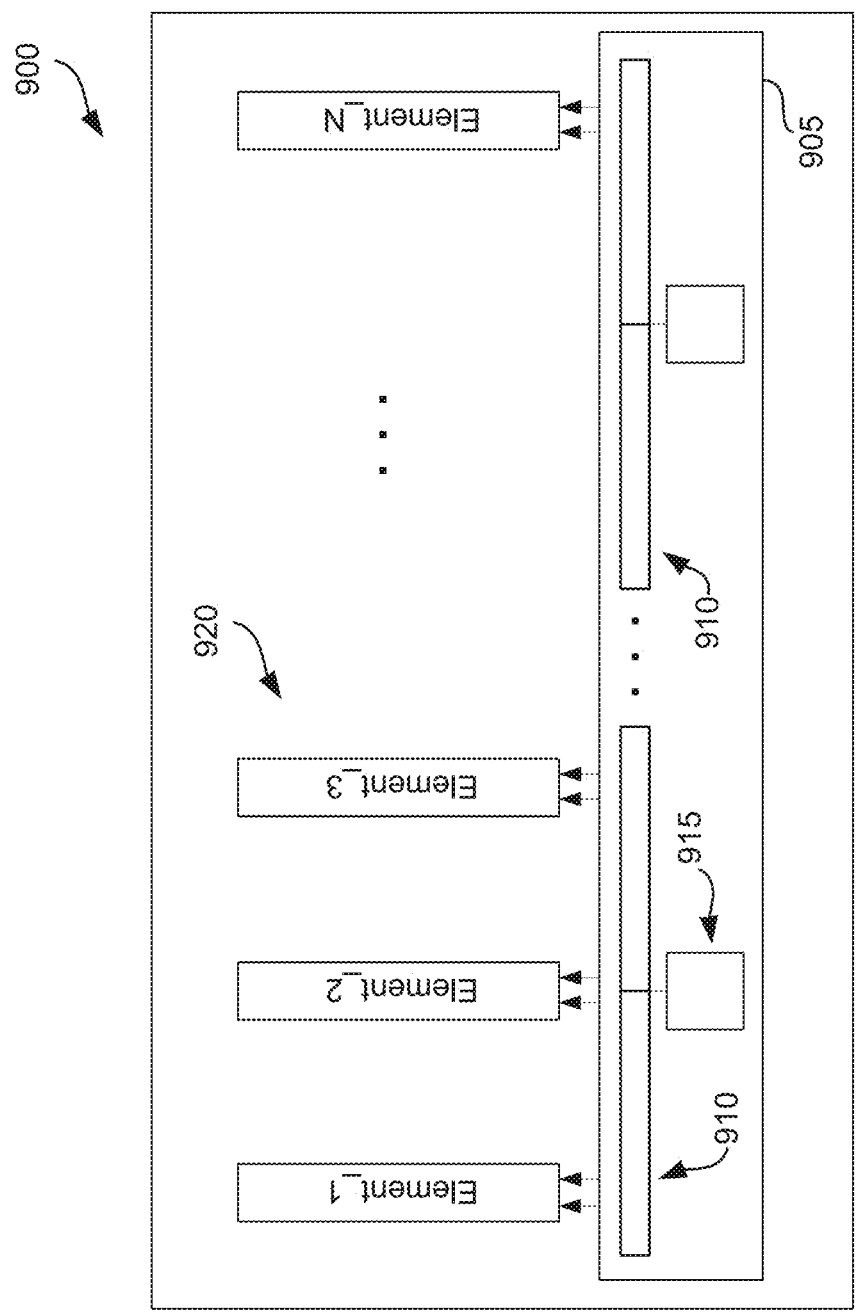
FIG. 9 illustrates an example of a global clock distribution network for distributing a clock signal globally in an integrated circuit.

FIG. 9 illustrates an example of a global clock distribution network 900 for distributing a clock signal globally in an integrated circuit. In an example, global clock distribution network 900 is configured to distribute low-power, low-jitter clocks in integrated circuits or digital systems, such as a central processor unit (CPU), to one or more nodes or elements 920 using a multi-stage distribution structure. In an example, global clock distribution network 900 distributes clock signal to nodes or elements 920 with amplitude and phase matching within a range of gain and phase error. In another example, such structure includes a clock distribution network 900 formed by one or more TL-based resonant networks 905, as described herein. TL-based resonant networks 905 are formed by cascading or serially connecting two or more clock distribution units 910 according to the techniques described herein. Each clock distribution unit 910 includes a parallel resonant circuit 915 having one or more adjustable capacitor or inductor elements to determine the resonant frequency of the TL-based resonant network. The clock distribution network 900 can be scaled or extended to distribute a clock across a large integrated circuit by cascading or serially coupling two or more TL-based resonant networks 905, as described herein.

Figure 10:
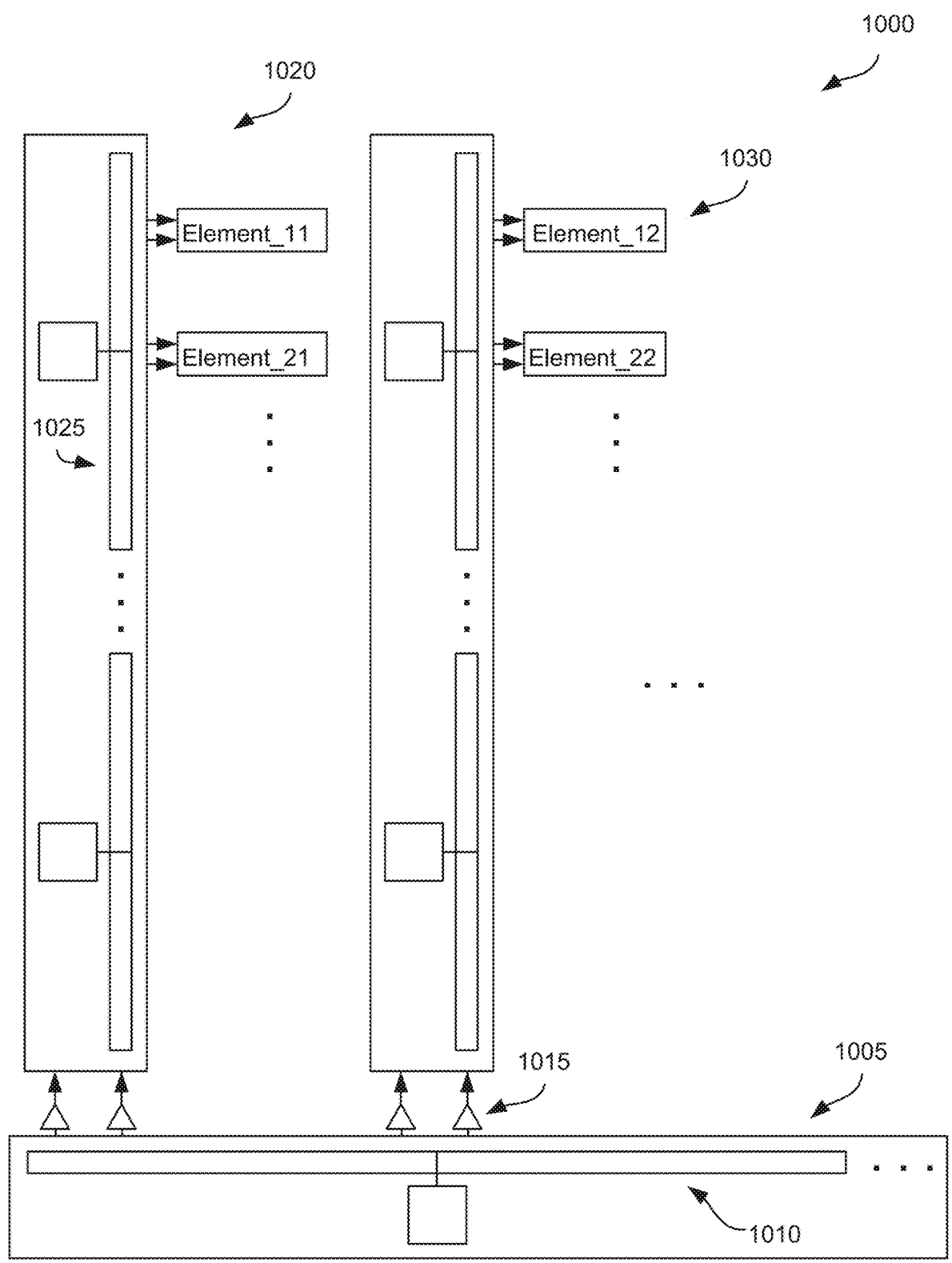
FIG. 10 illustrates an example of a two-stage global clock distribution network for distributing a clock signal globally in an integrated circuit.

FIG. 10 illustrates an example of a two-stage global clock distribution network 1000 for distributing a clock signal globally in an integrated circuit. In an example, two-state global clock distribution network 1000 is configured to distribute low-power, low-jitter clocks in integrated circuits or digital systems, such as a CPU, to one or more nodes or elements 1030 using a multi-stage distribution structure. In an example, two-stage global clock distribution network 1000 distributes clock signal to nodes or elements 1030 with amplitude and phase matching within a range of gain and phase error. In another example, such structure includes a first stage clock distribution network 1005 formed by one or more TL-based resonant networks or clock distribution units 1010. The structure can also include drive circuitry 1015 to receive an input clock signal from the output nodes of the first stage clock distribution network 1005. The structure also includes one or more second stage clock distribution networks 1020 formed by one or more TL-based resonant networks or clock distribution units 1025. Second stage clock distribution networks 1020 can be driven by drive circuitry 1015 to distribute clock signals to one or more nodes or elements 1030.

Figure 11:
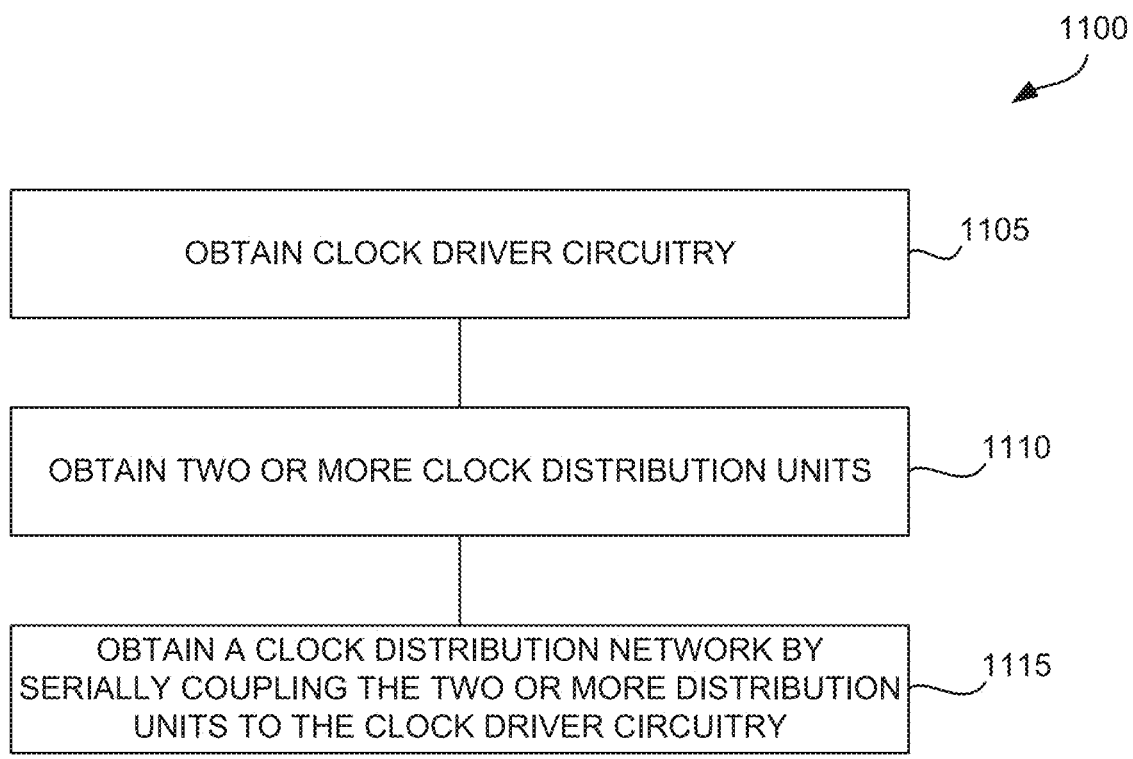
FIG. 11 illustrates steps of process for forming a clock distribution network using transmission-line-based resonant networks formed by one or more clock distribution units.

FIG. 11 illustrates steps of a process 1100 for forming a clock distribution network using TL-based resonant networks formed by one or more clock distribution units. The process 1100 can be used, such as in a (CAD) software application, to form any of the clock distribution networks described herein. At 1105 drive circuitry is obtained. In an example the driver circuit is obtained, such as from a library cell or through manual layout or schematic capture of a one or more examples of drive circuitry described herein. At 1110, two or more clock distribution units are obtained. In an example, the clock distributions are designed, fabricated, or drawn, such as in a schematic capture or CAD application, to include a segment of a TL and parallel resonant circuitry connected to, for example, the center of the transmission line, to provide LC termination, as described herein. At 1115, a clock distribution network is obtained, such as by cascading or serially connecting two or more clock distribution units to form a multi terminated TL, as described herein. Process 1100 can further include any additional steps suitable for forming the clock distribution units, TL-based resonant networks, or clock distributions networks described herein.

Example 1 is an integrated circuit comprising: a transmission-line-based resonant network formed by one or more clock distribution units, each clock distribution unit including: a transmission line segment having first and second ends; a resonant circuit connected to the transmission line segment at a position equidistant from the first end and the second end, the resonant circuit including an inductor connected in parallel with a capacitor, the resonant circuit, along with the transmission line segment, collectively having a resonant frequency about a frequency of the clock signal.

In Example 2, the subject matter of Example 1 includes, a signal filter circuit connected to the transmission-line-based resonant network, the signal filter circuit configured to attenuate signals having a frequency about or higher than a third harmonic frequency of the clock signal.

In Example 3, the subject matter of Example 2 includes, wherein the signal filter circuit includes a low-pass filter having a cutoff frequency about the third harmonic frequency of the clock signal.

In Example 4, the subject matter of Examples 2-3 includes, wherein the signal filter circuit includes a band-stop filter having a center frequency about the third harmonic frequency of the clock signal.

In Example 5, the subject matter of Examples 1-4 includes, wherein the transmission-line-based resonant network includes: a first signal path including a first clock distribution unit to conduct a first clock signal; and a second signal path including a second clock distribution unit to conduct a second clock signal, the first and second clock signals having a quadrature phase relationship, wherein: the first clock distribution unit is connected to a clock signal driver to provide the first clock signal, and an inductor of the second clock distribution unit is electromagnetically coupled to an inductor of the first clock distribution network to provide the second clock signal.

In Example 6, the subject matter of Examples 1-5 includes, wherein the transmission-line-based resonant network includes first and second termination points, the first termination point including a first resonant circuit of a first clock distribution unit of the one or more clock distribution units, the second termination point including a second resonant circuit of a second clock distribution unit of the one or more clock distribution units.

In Example 7, the subject matter of Examples 1-6 includes, wherein the resonant circuit includes a switching circuit connected to the capacitor or the inductor to adjust the resonant frequency of the resonant circuit by respectively adjusting a capacitance of the capacitor or an inductance of the inductor.

In Example 8, the subject matter of Examples 1-7 includes, wherein the transmission-line-based resonant network includes two or more clock distribution units that are serially connected such that a length of the transmission-line-based resonant network is an integer multiple of a length of the transmission line segment of the clock distribution unit.

In Example 9, the subject matter of Examples 1-8 includes, wherein a quantity of the one or more clock distribution units used to form the transmission-line-based resonant network is determined based on an indicated length of the transmission-line-based resonant network and a wavelength of the clock signal conducted by the transmission-line-based resonant network.

Example 10 is a circuit comprising: a transmission-line-based resonant network formed by two or more serially connected clock distribution units, each clock distribution unit including: a transmission line segment having a first end and a second end; a resonant circuit connected to the transmission line segment at a position between the first end and the second end of the transmission line segment, the resonant circuit including a capacitor connected in parallel with an inductor, the resonant circuit, along with the transmission line segment, collectively having a resonant frequency that is about a frequency of the clock signal; wherein an impedance of the transmission line segment between the first end of the transmission line segment and the position is matched to an impedance of the transmission line segment between the second end of the transmission line segment and the position.

In Example 11, the subject matter of Example 10 includes, a filter circuit connected to the transmission-line-based resonant network, the filter circuit configured to attenuate signals having a frequency about or higher than a third harmonic frequency of the clock signal.

In Example 12, the subject matter of Example 11 includes, wherein the filter circuit includes a low-pass filter circuit having a cutoff frequency about the third harmonic frequency of the clock signal.

In Example 13, the subject matter of Examples 11-12 includes, wherein the filter circuit is a band-stop filter circuit having a center frequency about the third harmonic frequency of the clock signal.

In Example 14, the subject matter of Examples 10-13 includes, wherein the transmission-line-based resonant network includes: a first signal path including a first clock distribution unit to conduct a first clock signal, and a second signal path including a second clock distribution unit to conduct a second clock signal, the first and second clock signals having a quadrature phase relationship, wherein: the first clock distribution unit is connected to clock signal driver to provide the first clock signal, and an inductor of the second clock distribution unit is electromagnetically coupled to an inductor of the first clock distribution network to provide the second clock signal.

Example 15 is a method comprising: obtaining a clock driver circuit; obtaining first and second clock distribution units, each clock distribution unit formed by: obtaining a transmission line segment having a first end and a second end; connecting a resonant circuit to the transmission line segment at a position between the first and second ends of the transmission line segment, wherein the resonant circuit includes, a capacitor connected in parallel with an inductor, and the resonant circuit, along with the transmission line segment, collectively has a resonant frequency that is about a frequency of the clock signal; and obtaining a clock distribution network by connecting the first clock distribution unit of the one or more clock distribution units to an output of the clock driver circuit and serially connecting the second clock distribution unit of the one or more clock distribution units to the first clock distribution unit.

In Example 16, the subject matter of Example 15 includes, wherein connecting the resonant circuit to the transmission line segment at a position between the first end and the second end of the transmission line segment includes connecting the resonant circuit at a position on the transmission line segment equidistant from the first and second ends of the transmission line segment.

In Example 17, the subject matter of Example 16 includes, connecting a signal filter circuit between the output the clock driver circuit and the first clock distribution unit, wherein the signal filter circuit is configured to attenuate signals having a frequency about or higher than a third harmonic frequency of the clock signal.

Example 18 is method of Example 16, wherein connecting a filter circuit between the output of the clock driver circuit and the first clock distribution unit includes: connecting a low-pass filter having a cutoff frequency about the third harmonic frequency of the clock signal between the output of the clock driver circuit and the first clock distribution unit; or connecting a band-stop filter having a center frequency about the third harmonic frequency of the clock signal between the output of the clock driver circuit and the first clock distribution unit.

Example 19 is method of Example 15, wherein forming the transmission-line-based resonant network includes: forming a first signal path including first and second clock distribution units to conduct a first clock signal; forming a second signal path including third and fourth clock distribution units to conduct a second clock signal, the first and second clock signal having a quadrature phase relationship; connecting the first clock distribution unit to the clock signal driver to provide the first clock signal; and electromagnetically coupling an inductor of the second clock distribution unit to an inductor of the first clock distribution network to provide the second clock signal.

Example 20 is at least one machine-readable medium including instructions that, when executed by processing circuitry, cause the processing circuitry to perform operations to implement of any of Examples 1-19.

Example 21 is an apparatus comprising means to implement of any of Examples 1-19.

Example 22 is a system to implement of any of Examples 1-19.

Example 23 is a method to implement of any of Examples 1-19.

In the present disclosure, for purposes of explanation, numerous specific details are set forth in order to provide a thorough understanding of some example examples. It will be evident, however, to one skilled in the art that the present disclosure may be practiced without these specific details.

Examples, as described herein, may include, or may operate on, logic or a number of components, modules, or mechanisms. Modules may be hardware, software, or firmware communicatively coupled to one or more processors in order to carry out the operations described herein. Modules may be hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

Circuitry or circuits, as used in this document, may comprise, for example, singly or in any combination, hardwired circuitry, programmable circuitry such as computer processors comprising one or more individual instruction processing cores, state machine circuitry, and/or firmware that stores instructions executed by programmable circuitry. The circuits, circuitry, or modules may, collectively or individually, be embodied as circuitry that forms part of a larger system, for example, an integrated circuit (IC), system on-chip (SoC), desktop computers, laptop computers, tablet computers, servers, smart phones, etc.

As used in any example herein, the term "logic" may refer to firmware and/or circuitry configured to perform any of the aforementioned operations. Firmware may be embodied as code, instructions or instruction sets and/or data that are hard-coded (e.g., nonvolatile) in memory devices and/or circuitry.

"Circuitry," as used in any example herein, may comprise, for example, singly or in any combination, hardwired circuitry, programmable circuitry, state machine circuitry, logic and/or firmware that stores instructions executed by programmable circuitry. The circuitry may be embodied as an integrated circuit, such as an integrated circuit chip. In some examples, the circuitry may be formed, at least in part, by the processor circuitry executing code and/or instructions sets (e.g., software, firmware, etc.) corresponding to the functionality described herein, thus transforming a general-purpose processor into a specific-purpose processing environment to perform one or more of the operations described herein. In some examples, the processor circuitry may be embodied as a stand-alone integrated circuit or may be incorporated as one of several components on an integrated circuit. In some examples, the various components and circuitry of the node or other systems may be combined in a SoC architecture.

The above detailed description includes references to the accompanying drawings, which form a part of the detailed description. The drawings show, by way of illustration, specific examples that may be practiced. These examples are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other examples may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as examples may feature a subset of said features. Further, examples may include fewer features than those disclosed in a particular example. Thus, the following claims are hereby incorporated into the Detailed Description, with a claim standing on its own as a separate example. The scope of the examples disclosed herein is to be determined with reference to the appended claims, along with the full scope of equivalents to which such claims are entitled.

What is claimed is:

1. An integrated circuit, comprising:
   a transmission-line-based resonant network formed by one or more clock distribution units, each clock distribution unit including:
   a transmission line segment having first and second ends; and
   a resonant circuit connected to the transmission line segment at a position equidistant from the first end and the second end, the resonant circuit including an inductor connected in parallel with a capacitor, the resonant circuit, along with the transmission line segment, collectively having a resonant frequency about a frequency of a clock signal.

2. The integrated circuit of claim 1, further comprising a signal filter circuit connected to the transmission-line-based resonant network, the signal filter circuit configured to attenuate signals having a frequency equal to or higher than a third harmonic frequency of the clock signal.

3. The integrated circuit of claim 2, wherein the signal filter circuit includes a low-pass filter having a cutoff frequency about the third harmonic frequency of the clock signal.

4. The integrated circuit of claim 2, wherein the signal filter circuit includes a band-stop filter having a center frequency about the third harmonic frequency of the clock signal.

5. The integrated circuit of claim 1, wherein the transmission-line-based resonant network includes:
   a first signal path including a first clock distribution unit to conduct a first clock signal; and
   a second signal path including a second clock distribution unit to conduct a second clock signal, the first and second clock signals having a quadrature phase relationship, wherein:
   the first clock distribution unit is connected to a clock signal driver to provide the first clock signal, and
   an inductor of the second clock distribution unit is electromagnetically coupled to an inductor of the first clock distribution network to provide the second clock signal.

6. The integrated circuit of claim 1, wherein the transmission-line-based resonant network includes first and second termination points, the first termination point including a first resonant circuit of a first clock distribution unit of the one or more clock distribution units, the second termination point including a second resonant circuit of a second clock distribution unit of the one or more clock distribution units.

7. The integrated circuit of claim 1, wherein the transmission-line-based resonant network includes two or more clock distribution units that are serially connected such that a length of the transmission-line-based resonant network is an integer multiple of a length of the transmission line segment of the clock distribution unit.

8. The integrated circuit of claim 1, wherein a quantity of the one or more clock distribution units used to form the transmission-line-based resonant network is determined based on an indicated length of the transmission-line-based resonant network and a wavelength of the clock signal conducted by the transmission-line-based resonant network.

9. An integrated circuit, comprising:
   a transmission-line-based resonant network formed by two or more serially connected clock distribution units, each clock distribution unit including:
   a transmission line segment having a first end and a second end; and
   a resonant circuit connected to the transmission line segment at a position between the first end and the second end of the transmission line segment, the resonant circuit including a capacitor connected in parallel with an inductor, the resonant circuit, along with the transmission line segment, collectively having a resonant frequency that is about a frequency of a clock signal;
   wherein an impedance of the transmission line segment between the first end of the transmission line segment and the position is matched to an impedance of the transmission line segment between the second end of the transmission line segment and the position.

10. The integrated circuit of claim 9, further comprising a filter circuit connected to the transmission-line-based resonant network, the filter circuit configured to attenuate signals having a frequency equal to or higher than a third harmonic frequency of the clock signal.

11. The integrated circuit of claim 10, wherein the filter circuit includes a low-pass filter circuit having a cutoff frequency about the third harmonic frequency of the clock signal.

12. The integrated circuit of claim 10, wherein the filter circuit is a band-stop filter circuit having a center frequency about the third harmonic frequency of the clock signal.

13. The integrated circuit of claim 9, wherein the transmission-line-based resonant network includes:
- a first signal path including a first clock distribution unit to conduct a first clock signal, and
- a second signal path including a second clock distribution unit to conduct a second clock signal, the first and second clock signals having a quadrature phase relationship, wherein:
- the first clock distribution unit is connected to clock signal driver to provide the first clock signal, and
- an inductor of the second clock distribution unit is electromagnetically coupled to an inductor of the first clock distribution network to provide the second clock signal.

14. A method, comprising:
- obtaining a clock driver circuit; and
- obtaining first and second clock distribution units, each clock distribution unit formed by:
- obtaining a transmission line segment having a first end and a second end; and
- connecting a resonant circuit to the transmission line segment at a position equidistant from the first and second ends of the transmission line segment, wherein the resonant circuit includes a capacitor connected in parallel with an inductor, and the resonant circuit, along with the transmission line segment, collectively has a resonant frequency that is about a frequency of a clock signal; and
- obtaining a clock distribution network by connecting the first clock distribution unit of one or more clock distribution units to an output of the clock driver circuit and serially connecting the second clock distribution unit of the one or more clock distribution units to the first clock distribution unit.

15. The method of claim 14, wherein connecting the resonant circuit to the transmission line segment at a position between the first end and the second end of the transmission line segment includes connecting the resonant circuit at a position on the transmission line segment equidistant from the first and second ends of the transmission line segment.

16. The method of claim 15, further comprising connecting a signal filter circuit between the output the clock driver circuit and the first clock distribution unit, wherein the signal filter circuit is configured to attenuate signals having a frequency equal to or higher than a third harmonic frequency of the clock signal.

17. The method of claim 15, wherein connecting a filter circuit between the output of the clock driver circuit and the first clock distribution unit includes:
- connecting a low-pass filter having a cutoff frequency about a third harmonic frequency of the clock signal between the output of the clock driver circuit and the first clock distribution unit; or
- connecting a band-stop filter having a center frequency about the third harmonic frequency of the clock signal between the output of the clock driver circuit and the first clock distribution unit.

18. The method of claim 14, further comprising forming a transmission-line-based resonant network including:
- forming a first signal path including first and second clock distribution units to conduct a first clock signal;
- forming a second signal path including third and fourth clock distribution units to conduct a second clock signal, the first and second clock signal having a quadrature phase relationship;
- connecting the first clock distribution unit to the clock signal driver to provide the first clock signal; and
- electromagnetically coupling an inductor of the second clock distribution unit to an inductor of the first clock distribution network to provide the second clock signal.

* * * * *